(12) United States Patent
Happer et al.

(10) Patent No.: US 6,318,092 B1
(45) Date of Patent: Nov. 20, 2001

(54) ALKALI METAL HYBRID SPIN-EXCHANGE OPTICAL PUMPING

(75) Inventors: William Happer, Princeton; Gordon D. Cates, Jr., Skillman, both of NJ (US); Mikhail V. Romalis, Seattle, WA (US); Christopher J. Erickson, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/485,833

(22) PCT Filed: Aug. 17, 1998

(86) PCT No.: PCT/US98/17030

§ 371 Date: Feb. 15, 2000

§ 102(e) Date: Feb. 15, 2000

(87) PCT Pub. No.: WO99/08766

PCT Pub. Date: Feb. 25, 1999

Related U.S. Application Data

(60) Provisional application No. 60/056,352, filed on Aug. 18, 1997.

(51) Int. Cl.$^7$ .................................................... B01D 8/00
(52) U.S. Cl. ................................................ 62/55.5; 62/637
(58) Field of Search ............................. 62/55.5, 637, 925

(56) References Cited

U.S. PATENT DOCUMENTS

| | | | |
|---|---|---|---|
| 4,450,407 | 5/1984 | Kwon et al. | 324/304 |
| 4,765,818 | 8/1988 | Che et al. | 65/18.1 |
| 5,007,243 | 4/1991 | Yamaguchi et al. | 62/51.1 |
| 5,039,500 | 8/1991 | Shino et al. | 423/262 |
| 5,545,396 | 8/1996 | Albert et al. | 424/93 |
| 5,612,103 | 3/1997 | Driehuys et al. | 428/34.7 |
| 5,617,860 | 4/1997 | Chupp et al. | 128/653.4 |
| 5,642,625 | 7/1997 | Cates, Jr. et al. | 62/55.5 |
| 5,809,801 | 9/1998 | Cates, Jr. et al. | 62/637 |
| 5,860,295 | 1/1999 | Cates, Jr. et al. | 62/637 |
| 5,934,103 * | 8/1999 | Ryan et al. | 62/637 |

FOREIGN PATENT DOCUMENTS

| | | | |
|---|---|---|---|
| WO96/40585 | 12/1996 | (WO) | C01B/23/00 |

OTHER PUBLICATIONS

Arimoto, et al., "Development of Measurement and Control System for Polarized $^3$ He Ion Source Based on Electron Pumping," The 11th Symposium on Accelerator Science and Technology, Harima Science Garden City, pp. 14–16 (1997).
Bhaskar et al., "Efficiency of Spin Exchange between Rubidium Spins and $^{129}$Xe Nuclei in a Gas", Physical Review Letters, vol. 49, No. 1, pp. 25–28 (Jul. 5, 1982).
Bouchiat et al., "Relaxation of Optically Pumped Rb Atoms on Paraffin–Coated Walls," Phys. Rev., vol. 147, No. 1 (Jul. 8, 1966).
Bouchiat et al., "Nuclear Polarization in He3 Gas Induced by Optical Pumping and Dipolar Exchange," Phys. Rev. Lett., vol. 5, No. 8, pp. 373–375 (1960).
Cates, "New Results from Spin–Exchange Optical Pumping," Am. Inst. Phys. pp. 3–15 (1998).
Colegrove et al., Polarization of He$^3$ Gas by Optical Pumping,: Phys. Rev., vol. 132, No. 6, pp. 2561–2572 (1963).
Cummings et al., "Optical pumping of Rb vapor using high–power $Ga_{1-x}A_x$ As diode laser arrays", Phys. Rev. A, vol. 51, No. 6, pp. 4842–4851 (1995).
Grover, B.D., "Noble–Gas NMR Detection through Noble–Gas–Rubidium Hyperfine Contact Interaction," Phys. Rev. Lett., vol. 40, No. 6, pp. 391–392 (1978).
Happer et al., "An Optical Pumping Primer," Hyperfine Interactions, vol. 38, pp. 435–470 (1987).
Happer et al., "Polarization of the nuclear spins of noble–gas atoms by spin exchange with optically pumped alkali–metal atoms," Phys. Rev. A, vol. 29, No. 6, p. 3092–3110 (Jun. 1984).
Li et al., "Long–range, collision–induced hyperpolarizabilities of atoms or centrosymmetric linear molecules: Theory and numerical results for pairs containing H or He," J. Chem. Phys., vol. 105, No. 24, pp. 10954–10968 (Dec. 22, 1996).
Romalis et al., "Accurate $^3$He Polarimetry Using the Rb Zeeman Frequency Shift Due to the Rb–$^3$He Spin–Exchange Collisions," Phys. Rev. A, vol. 58, No. 4, pp. 3004–3011 (Oct. 1998).
Schaefer, S.R. et al., "Determination of spin–exchange parameters between optically pumped rubidium and $^{83}$Kr," Phys. Rev. A., vol. 41, No. 11, pp. 6063–6070 (1990).
Wagshul et al., "Laser Optical Pumping of High–Density Rb in Polarized $^3$He Targets," Phys. Rev. A, vol. 49, p. 3854–3869 (1994).
Wagshul et al., "Optical Pumping of High–Density Rb With a Broadband Dye Laser and GaAlAs Siode Laser Arrays: Application to $^3$He Polarization," Phys. Rev. A., vol. 40, No. 8, pp. 4447–4454 (1989).
Wagshul et al., "Optical Pumping of High–Density Rb With a Broadband Dye Laser and GaAlAs Siode Laser Arrays: Application to $^3$He Polarization," Phys. Rev. A., vol. 40, No. 8, pp. 4447–4454 (1989).
PCT International Search Report, International Application No. PCT/US98/17030, mailed May 27, 1999.
Nacher et al; "Recent Results on Hyperpolarized 3He–4He liquid mixtures", Abstract; J. Phys. & Czech, (1996) 46, pp 3025–3032.
Tanja Pietrass, et al; Optically Polarized $^{129}$Xe in NMR Spectroscopy, Advanced Materials XP–002098966, pp 826–838.

* cited by examiner

*Primary Examiner*—Henry Bennett
*Assistant Examiner*—Melvin Jones
(74) *Attorney, Agent, or Firm*—Myers Bigel Sibley & Sajovec, P.A.

(57) ABSTRACT

Methods of hyperpolarizing a noble gas by spin-exchange optical pumping use an alkali metal hybrid comprising a primary alkali metal and an auxiliary alkali metal to effectuate spin transfer interaction among the primary alkali metal, the auxiliary alkali metal, and the noble gas.

26 Claims, No Drawings

ALKALI METAL HYBRID SPIN-EXCHANGE OPTICAL PUMPING

This application is a National Stage application of International Application Serial No. PCT/US98/17030 filed Aug. 17, 1998 and published under Article PCT 21(2) in English. The International application claims the benefit of priority of U.S. Provisional Application No. 60/056,352, filed Aug. 18, 1997. The invention was made with U.S. Government support. The U.S. Goverment has certain rights in the invention.

BACKGROUND OF THE INVENTION

The invention to methods of hyperpolarizing noble gases. More particularly, the invention relates to methods of high efficiency optical pumping methods for hyperpolarizing noble gases.

It is known that noble gases such as $^3$He and $^{129}$Xe can be "hyperpolarized" using laser techniques. Such polarization methods include spin-exchange optical pumping, by which an alkali metal vapor is optically polarized, followed by "exchange" of this polarization with the noble gas (Bouchiat et al. 1960; Bhaskar et al. 1982; Happer et al. 1984; Zeng et al. 1985; Cates et al. 1992). Other polarization methods employ metastability exchange, in which noble gas nuclei (typically helium-3 ($^3$He)) are directly optically pumped without an alkali metal intermediary (Schearer 1969; Laloë et al. 1984). Systems for producing polarized noble gases are described in U.S. Pat. Nos. 5,642,625 and 5,617,860, the complete disclosures of which are incorporated herein by reference.

Hyperpolarized noble gases can be used for numerous purposes. Historically, polarized $^{129}$Xe has been used for fundamental symmetry studies (Chupp et al. 1994), nuclear spin relaxation studies of solids (Gatzke et al. 1993), high resolution nuclear magnetic resonance spectroscopy (NMR) (Raftery et al. 1991), and cross-polarization to other nuclei (Gatzke et al. 1993; Long et al. 1993). Polarized $^3$He is also an important nuclear target (Anthony et al. 1993; Middleton (1994)).

Most recently, the enhanced NMR signals of laser polarized $^{129}$Xe, which are about five orders of magnitude larger than those from thermally polarized $^{129}$Xe, have made possible the first high-speed biological magnetic resonance imaging (MRI) of a gas (Albert et al. 1994). Helium-3 has also proven to be an excellent nucleus for gas phase MRI (Middleton et al. 1995). U.S. Pat. No. 5,545,396 describes the use of $^{129}$Xe, $^3$He, and other noble gas nuclei for biological MRI. These striking advances are now opening many new avenues of research.

The principal limitation in these applications of polarized noble gases has been the availability of sufficient quantities of the gases to meet the demand. Accordingly, attention has been directed to improving the rates of polarized noble gas production. Apparatus has been devised by which larger quantities of polarized gas can be produced on a continuous or batch mode basis. See U.S. Pat. No. 5,642,645. Methods for limiting depolarization of noble gases by interactions with container surfaces have been addressed by providing polymers as coatings. U.S. Pat. No. 5,612,103. Apparatus has also been developed to permit storage of frozen polarized $^{129}$Xe. See U.S. application Ser. No. 08/622,865, filed on Mar. 29, 1996, the complete disclosure of which is incorporated herein by reference.

Even with these advances, the processes by which noble gases can be polarized are capable of further improvement, as many parameters have not been optimized. For example, efficiency of polarization is limited by the physical properties of the materials used to construct the polarizing apparatus. Moreover, an incomplete understanding of theoretical considerations underlying the physics of spin exchange in various systems implies that opportunities exist to identify systems with greater efficiencies.

From a practical perspective, hyperpolarization efficiency is related to laser power, while the cost of laser installation and maintenance often increases directly with delivered power. Accordingly, polarization systems for producing higher amounts of polarized noble gases can require significantly more expensive lasers. Therefore, it would be desirable to enable the artisan to increase the polarization yield of a given laser, and thereby to mitigate expense in scaled-up systems.

Accordingly, it is one of the purposes of this invention to overcome the above limitations in the art of spin-exchange optical pumping methods, by providing methods by which polarization efficiently is significantly improved using currently available apparatus. It is another purpose of the invention to provide the artisan with materials and methods that enable a wider variety of apparatus useful for polarizing noble gases.

SUMMARY OF THE INVENTION

It has now been discovered that these and other objectives can be achieved by the present invention, which in one embodiment is a method of hyperpolarizing a noble gas by spin-exchange optical pumping, comprising:

providing a polarization cell containing a noble gas and an alkali metal hybrid, wherein the alkali metal hybrid comprises a primary alkali metal and an auxiliary alkali metal; and illuminating the polarization cell with radiation having a wavelength appropriate to optically polarize the primary alkali metal; thereby enabling spin-exchange interaction among the primary alkali metal, the auxiliary alkali metal, and the noble gas; whereby spin transfer to the noble gas yields hyperpolarized noble gas.

In the invention, the ratio of the primary alkali metal to the auxiliary alkali metal in the condensed phase can be from about 1:100 to about 100:1, and is preferably from about 1:25 to about 25.1. The ratio of the primary to the auxiliary alkali metals in the vapor phase can be from about 1:100 to about 10:1, more preferably from about 1:30 to about 1:1. It is preferred that an auxiliary alkali metal has greater efficiency than the primary alkali metal in polarizing the noble gas.

In one preferred alkali metal hybrid, the primary alkali metal is rubidium and the auxiliary alkali metal is potassium. In this case, a preferred ratio of the rubidium to the potassium is about 5:95. In an alternative alkali metal hybrid, the primary alkali metal is potassium, the auxiliary alkali metal is sodium. In another alternative alkali metal hybrid, the primary alkali metal is sodium, and the auxiliary alkali metal is potassium. The use of potassium and sodium enhances removal of the alkali metal from the hyperpolarized gas, since sodium and potassium have lower vapor pressures.

A preferred noble gas useful according to the invention is $^3$He. The polarization cell can further contain a buffer gas and/or a quenching gas.

In another embodiment, the invention is a method of hyperpolarizing a noble gas, comprising:

a) optically polarizing a primary alkali metal by illumination with radiation having a wavelength that is resonant with an electronic transition in the primary alkali metal;

b) transferring polarization of the primary alkali metal to an auxiliary alkali metal; and c) delivering polarization of the auxiliary alkali metal to a noble gas, thereby providing a noble gas having increased polarization.

Preferably, the primary alkali metal is rubidium, and the auxiliary alkali metal is potassium. Alternatively, the primary alkali metal is potassium, and the auxiliary alkali metal is sodium.

In another embodiment, the invention is apparatus for hyperpolarizing a noble gas by spin-exchange optical pumping, comprising:

a polarization cell containing an alkali metal hybrid, wherein the alkali metal hybrid comprises a primary alkali metal and an auxiliary alkali metal, provided that the primary alkali metal is capable of substantial optical polarization at a polarizing wavelength of light while the auxiliary alkali metal is not capable of significant polarization at the polarizing wavelength.

In the apparatus, the alkali metal hybrid is preferably an alloy of rubidium and potassium, more preferably an alloy comprising about 5% rubidium and about 95% potassium. Alternatively, the alkali metal hybrid is an alloy of sodium and potassium.

In another embodiment, the invention is a method of hyperpolarizing a noble gas by a spin-exchange optical pumping, comprising:

illuminating a polarization cell containing an alkali metal and a noble gas with radiation of a wavelength resonant with an electronic transition of the alkali metal under conditions and for a time sufficient to optically polarize alkali metal atoms, whereupon spin exchange between optically polarized alkali metal atoms and noble gas atoms yields polarized noble gas atoms:

wherein the improvement is providing an alkali metal that is an alkali metal hybrid, wherein the alkali metal hybrid comprises a primary alkali metal capable of optical polarization and an auxiliary alkali metal capable of mediating spin transfer from the optically polarized primary alkali metal atoms to the noble gas atoms.

In another embodiment, the invention is a method of hyperpolarizing a noble gas, comprising:

a) optically polarizing an alkali metal by illumination with radiation having a wavelength that is resonant with an electronic transition in the alkali metal;

b) transferring the polarization of the alkali metal to a spin-exchange mediating species; and c) delivering the polarization of the spin-exchange mediating species to a noble gas, thereby providing a noble gas having increased polarization. In this embodiment, it is preferred that the spin-exchange mediating species is a second alkali metal.

Accordingly, the invention now enables the artisan to increase the efficiency of any given spin-exchange polarization system without modifying the physical hardware of the system. The invention permits the artisan to polarize a noble gas more efficiently, by providing an alkali metal hybrid in which one alkali metal is optically polarized and another alkali metal functions to mediate spin transfer to the noble gas. Accordingly, less expensive laser systems can be employed with significant cost and maintenance savings, while the yield of polarized noble gases is substantially increased.

These and other advantages of the present invention will be appreciated from the detailed description and examples are set forth herein. The detailed description and examples enhance the understanding of the invention, but are not intended to limit the scope of the invention.

DETAILED DESCRIPTION OF THE PREFERRED EMBODIMENTS

The present invention is directed to improving methods of hyperpolarizing noble gases by spin-exchange optical pumping. The technique of polarizing noble gas nuclei by spin-exchange optical pumping involves two stages. In the first stage circularly polarized resonant laser light is employed to illuminate an alkali metal vapor, to optically align (polarize) the electron spin of the alkali metal atoms. This first stage is designated "optical pumping." In the second stage, some of the alignment (polarization) is transferred to the nuclei of a noble gas during spin-exchange collisions between the polarized alkali metal atoms and the noble gas atoms. This second state is designated "spin exchange." The end result of this two-stage process is the transfer of angular momentum from the laser beam to the nuclei of the noble gas atoms.

In somewhat greater detail, spin exchange using an alkali metal starts with providing a vapor (preferably saturated) of the alkali metal in a polarization chamber. Typically this is achieved by heating the chamber in an oven, with the temperature selected according to the particular alkali metal employed. The alkali metal vapor is then irradiated with circularly polarized light at the wavelength of a significant resonance of the alkali metal. Typically, the light has a wavelength at the first principal resonance, i.e., the $D_1$ electronic transition. For rubidium, the wavelength is 795 nm. The ground state atoms are lifted to an excited state by absorbing the incident energy, and subsequently decay back to the ground state. In a modest magnetic field, e.g., about 10 G, this cycling of atoms between the ground state and the excited states leads to large (nearly 100%) polarizations in the first few milliseconds following illumination.

The electronic polarization is carried mostly by the lone valence electron of the alkali metal. Therefore, essentially all of these electrons have their spins either aligned or anti-aligned to the magnetic field depending upon the helicity (right- or left-handed circular polarization state) of the pumping light. If a noble gas with non-zero nuclear spin is also present, the alkali metal atoms can undergo collisions with the noble gas atoms through which the polarization of the valence electrons is transferred to the noble gas nuclei by means of a mutual spin flip. This spin "exchange" results from the Fermi-contact hyperfine interaction between the electron and the noble gas nucleus.

The efficiency of the process of transferring angular momentum from the laser to the nuclei of the noble gas atoms is defined as the number of noble gas nuclei polarized divided by the number of laser photons used in the process. The physical basis for the efficiency of spin-exchange optical pumping is the competition between the spin-transfer processes and other processes that destroy the spin. The number of photons produced by a laser system is directly proportional to the output power of the laser. Therefore, a method of producing polarized noble gas that has a higher spin-exchange optical pumping efficiency can utilize a less powerful, and loss costly, laser system to polarize a given quantity of gas to a given degree.

When considering the process of spin exchange from an alkali metal to the noble gas, efficiency is defined as the fraction of angular momentum transferred to the noble gas divided by the sum of the angular momentum transferred to the noble gas and the angular momentum lost through other mechanisms. It has now been found that, surprisingly, the efficiency that characterizes spin exchange between alkali metals and a noble gas can be significantly modulated by selecting a combination of alkali metals, termed herein an "alkali metal hybrid." In particular, it is now possible to substantially increase the efficiency of spin-exchange optical pumping by selecting appropriate combinations of alkali metals. For example, it has now been observed that the efficiency characterizing spin exchange between potassium (K) and helium-3 ($^3$He) is about ten times greater than the efficiency of spin exchange between rubidium (Rb) and $^3$He. An Rb—K hybrid according to the invention significantly improves efficiency over that possible using Rb alone.

The invention described herein uses a hybrid mixture of two different alkali metals in the optical pumping vessel. The use of the alkali metal hybrid can substantially increase the efficiency of the spin-exchange optical pumping process over that of conventional techniques that only utilize a single alkali metal species in the optical pumping vessel. Among the advantages of the method of the invention is that the alkali metal hybrid can be used in the context of established and available methods for optically pumping the alkali metal vapor.

Without wishing to be bound by theory, it is hypothesized that in spin-exchange optical pumping with two different alkali metals according to the invention, the primary pathway for the angular momentum is consistent without regard to which two alkali metals are employed. This can be exemplified in the context of an alkali metal hybrid comprising rubidium and potassium.

Angular momentum enters the optical pumping chamber in the form of circularly polarized laser photons tuned to the Rb $D_1$ electronic transition, aligning the valence electron spin of the Rb atom. The polarized Rb atom then collides with a K atom, and the Rb polarization is then transferred to the K through the angular momentum-conserving electron—electron spin exchange process. The polarized K atom then collides with a noble gas atom, transferring the polarization from the valence electron of the K, atom to the nucleus of the noble gas atom. The use of K as an intermediary spin-exchange partner between the optically pumped Rb and the noble gas nuclei enables the artisan to gain part of the increase in efficiency associated with the K-$^3$He system. As a consequence, the artisan is enabled to overcome the fact that at present lasers capable of optically pumping the K directly are prohibitively expensive.

It may be noted that the primary pathway for transfer of angular momentum proceeds from the primary alkali metal to the auxiliary alkali metal and then to the noble gas, some fraction of the momentum will likely be transferred directly from the primary alkali metal to the noble gas. Indeed, the artisan will appreciate that numerous collisional processes will occur contemporaneously in a gas system comprising a plurality of components. However, it is typically the case that the contribution of the direct transfer mechanism to the net polarization of the noble gas is substantially less than the contribution of the hybrid transfer mechanism.

While the specific combination of Rb and K is an especially preferred alkali metal mixture, the invention can be practiced with any two alkali metals. For instance, the spin-exchange optical pumping efficiency of Na—$^3$He is predicted to be a factor of three greater than that for K—$^3$He. Therefore, the invention can alternatively be implemented using K—Na as the alkali metal mixture. In this scenario, the potassium is optically polarized, while spin transfer to the $^3$He is mediated through sodium.

Alternatively, given a radiation source emitting at an appropriate wavelength, sodium can be optically pumped with a polarization efficiency approaching 100%. Spin transfer to $^3$He can be mediated through a hybrid comprising sodium (primary alkali metal) and potassium (auxiliary alkali metal). The composition of the alkali metal hybrid can be adjusted so that only a minor amount of sodium is present, thereby minimizing ill effects associated with sodium's intrinsic tendency to attack the vessel structure. Thus, while the efficiency of the spin-exchange process using such an alkali metal hybrid is lower than that theoretically possible for sodium alone, the unique characteristics of the alkali metal hybrid enable the artisan to overcome a significant materials problem inherent in the use of sodium.

It is emphasized that lasers emitting radiation at wavelengths appropriate for optically polarizing sodium or potassium are available, but are presently economically impractical as compared to systems available for polarizing rubidium. Accordingly, the primary alkali metal in many applications will be rubidium. As more economical apparatus becomes available for optically polarizing other alkali metal, the artisan will find other combinations of alkali metal effective for polarizing noble gases in those situations.

Accordingly, the artisan will choose to design a practable system based on the comparative advantages of the component elements. For example, the artisan will consider parameters such as the efficiency of the optical pumping of particular alkali metals using particular lasers, the efficiency of spin exchange among the various alkali metals, as well as the efficiency of spin transfers from particular alkali metals to particular noble gases. Other parameters will also be considered, such as the temperature at which polarization can be performed, the flow rates achievable in flowing polarization systems, the conditions required to separate the alkali metal from the polarization noble gas, etc. Indeed, the method of the invention can be incorporated for use in flowing polarization systems such as that described in U.S. Pat. No. 5,642,625.

The method of the invention can be used to hyperpolarize any noble gas. Preferred noble gases for hyperpolarization include $^{129}$Xe and $^3$He, with $^3$He being more preferred. However, other noble gas isotopes having nuclear spin can be hyperpolarized according to the invention, including, for example, neon-21 ($^{31}$Ne), krypton-83 ($^{83}$Kr), and xenon-131 ($^{131}$Xe). The polarizable isotope of the noble gas may be present in the noble gas in natural abundance, or the noble gas may be enriched for the desired isotope.

The noble gas may be provided in admixture with a buffer gas and/or a quenching gas, to further promote polarization efficiency. Buffer gases function to pressure broaden the adsorption band of the primary alkali metal, and are desirable in high pressure polarization, especially when the polarizing radiation is provided as a band of wavelengths. A preferred quenching gas is $^4$He or hydrogen. Quenching gases function to suppress fluorescence by the alkali metal atoms during the hyperpolarizing process. Preferred quenching gases include nitrogen and hydrogen.

The alkali metals capable of acting as spin-exchange mediators in optically pumped systems include any of the alkali metals. Preferred alkali metals include sodium, potassium, rubidium, and cesium. Typically, these alkali metals will have natural isotopic abundance, without enrichment for particular isotopes. However, alkali metals enriched for isotopes may be employed. Preferred isotopes include lithium-7 ($^7$Li), sodium-23 ($^{23}$Na), potassium-39 ($^{39}$K), rubidium-85 ($^{85}$Rb), rubidium-87 ($^{87}$Rb), and cesium-133 ($^{133}$Cs).

The alkali metal hybrid useful according to the invention typically comprises a primary alkali metal and an auxiliary alkali metal. These terms are defined relative to a specific system for hyperpolarizing a particular noble gas. A primary alkali metal is defined as an alkali metal that is capable of substantial optical polarization in the hyperpolarizing system. An auxiliary alkali metal is defined as an alkali metal that (a) is capable of spin exchange with the primary alkali metal and the noble gas, and (b) is incapable of significant optical polarization at the wavelength used to polarize the primary alkali metal. The alkali metal hybrid is typically provided as a condensed-phase alloy of the primary and auxiliary alkali metals. However, during the polarization procedure the components of the alkali metal hybrid are each present at least in part in vapor phase.

Typically, in the condensed phase, the alkali metal hybrid contains the primary and auxiliary alkali metals in a ratio of from about 1:100 (~1% primary) to about 100:1 (~99% primary). More preferably, in the condensed phase the ratio of the primary to auxiliary alkali metals is from about 1:25 (~4% primary) to about 25:1 (~96% primary). In the case of an alkali metal hybrid in which rubidium is the primary alkali metal and potassium is the auxiliary alkali metal, the ratio of rubidium to potassium in the alloy can be about 5:59 (~5% primary).

Due to a combination of factors, the vapor phase ratio of the primary to the auxiliary alkali metal may differ significantly from that in the condensed phase. Factors affecting alkali metal vapor ratios include, for example, temperature of the polarizing chamber (directly related to volatility), comparative reactivity of the alkali metals with the walls of the polarization chamber, and the like. Accordingly, in the vapor phase, the ratio of primary to auxiliary alkali metal can be from about 1:100 (~1% primary) to about 10:1 (~91% primary), and is more preferably from about 1:30 (~3% primary) to about 1:1 (~50% primary), based on the number density of each alkali metal. To illustrate, the vapor phase ratio for the Rb—K hybrid given above is observed to be about 1:3 (~33%) at about 220° C., whereas, as noted, the condensed phase ratio is about 5:95 (~5%). In any event, it is preferred that the primary alkali metal be present in a sufficient quantity in vapor phase such that a significant fraction, more preferably substantially all, of the incident polarizing radiation is absorbed.

The relative efficiencies of various alkali metals for polarizing $^3$He is relatively well understood, being generally inversely related to atomic mass. In general, polarizing efficiency follows the sequence: Li, Na>K>Rb>Cs. The effect may be less significant in the case of heavier noble gases.

The alkali metal hybrid is typically provided as a small amount of metal deposited in the polarization chamber. The alkali metal is provided to establish the necessary alkali metal vapor within the polarization chamber under the conditions for polarization. Typically, the polarization chamber is heated to a temperature sufficient to create an appreciable number density of alkali metal atoms in the chamber. Preferably, the polarization chamber is heated to a temperature sufficient to provide saturated the gas in the chamber with vapor from at least one, and preferably both of the primary and auxiliary alkali metals. In flowing hyperpolarization systems, a vaporizer can be provided upstream of the polarization chamber to provide the necessary vapor. Also a condenser can be provided downstream of the polarization chamber to condense the alkali metal vapor leaving the chamber to a liquid or solid form. Such apparatus, and recirculating apparatus, are described in U.S. Pat. No. 5,642, 625. In addition, the use of Na and K enhances the removal of alkali metals from the hyperpolarized noble gas since these metals have a lower vapor pressure and therefore condense out of the hyperpolarized gas more readily than alkali metals with a higher vapor pressure. This results in a substantially pure hyperpolarized noble gas which is substantially free of alkali metals.

The maximum achievable steady state noble gas nuclear polarization depends upon the time constant characterizing the spin exchange with the alkali metal, and the time constant characterizing the relaxation of ($T_1$) due, for example, to contact with the surfaces of the pumping cell. Methods of inhibiting depolarization interaction between the polarized noble gas nuclei and surfaces are known in the art. For example, polarization chambers and other apparatus can be manufactured using materials that are substantially depleted in paramagnetic impurities. Also, polymeric coatings can be applied to the interior surfaces of apparatus, such as described in U.S. Pat. No. 5,612,103, the complete disclosure of which is incorporated herein by reference. However, an important consideration in constructing the polarization chamber is that it resist chemical degradation by the alkali metals. For example, sodium is quite reactive, especially at higher temperatures.

Any suitable source of irradiation can be employed, provided that the irradiation emission is appropriately matched to a useful electronic transition (e.g., $D_1$ or $D_2$) in the primary alkali metal. Typically, the irradiation source is a laser. Preferably, the hyperpolarizing photons are supplied by one or more diode laser arrays producing continuous wave (cw) power. However, any laser system that provides sufficient power at the alkali metal $D_1$ or $D_2$ lines may be acceptable. High pressure operation, in which the noble gas is provided in the polarization chamber at supra-atmospheric pressures, has been found to require lasers capable of delivering more than 10 W, and preferably more than about 50 W or power. Conventional lasers capable of delivering such power are prohibitively expensive to purchase and operate. Moreover, such lasers are bulky and require extensive installations. Diode laser arrays avoid many of these disadvantages, being small, relatively cheap, and inexpensive to operate.

Diode laser arrays are well known for use in optically pumping rubidium vapor for spin exchange with noble gases such as $^3$He and $^{129}$Xe (Chupp et al. 1989; Cummings et al. 1995). Conventional lasers emit coherent light of a single wavelength and accordingly exhibit an extremely narrow spectral profile. By contrast, diode lasers are broadband devices, typically emitting light at a continuous band of wavelengths, i.e., the emissions have a special width. Normally, this spectral width is relatively narrow, appearing as a broadening around some principal wavelength, and being only about 1–5 nm wide. It has been observed that the absorption band of alkali metal vapors can be broadened by use of high gas pressures in the polarization chamber. This can be accomplished by providing the noble gas in admixture with a buffer gas, at pressures up to about 10 atm. Diode arrays, therefore are desirably employed in conjunction with high gas pressure in the polarization cell to take advantage of pressure-induced broadening of the absorption band of the alkali metal. See e.g., U.S. Pat. No. 5,642,625.

The following examples are provided to assist in a further understanding of the invention. The particular materials and conditions employed are intended to be further illustrative of the invention and are not limiting upon the reasonable scope thereof.

EXAMPLE 1

An optical pumping cell is filled with a Rb—K alloy comprising 5% Rb and 95% K and is heated to 218° C. The chemistry of vapors over ideal solutions states that the vapor pressure of each alkali metal species is suppressed by its solution fraction. The equilibrium vapor pressures of alkali metals such as Rb and K are published in the *CRC Handbook of Chemistry and Physics,* 73rd edition, CRC Press, Boca Raton (1992), the complete disclosure of which is incorporated herein by reference. In this example, the ratio of K to Rb in the vapor phase of the optical pumping vessel is about 3 to 1, with the number density of K being about $3 \times 10^{14}$ cm$^{-3}$ and the number density of Rb being about $1 \times 10^{14}$ cm$^{-3}$. This choice of Rb number density is large enough to absorb a substantial fraction of the incident laser light. The total alkali metal number density is comparable to typical Rb number densities used in mono-alkali metal optical pumping vessels, so that the amount of time required to polarize a given quantity of the noble gas would be the same with the two methods. However, due to the alkali metal mixture, this spin-exchange optical pumping vessel is more efficient. Assigning reasonable values to other relevant quantities, the maximum attainable $^3$He polarization utilizing this mixture is 65%. The efficiency of a spin-exchange optical pumping system operating with this alkali metal hybrid is up to five times higher than that of a pure Rb cell. Thus, five times as much noble gas can be polarized with the same laser. Since the price of the laser represents the major cost in constructing a spin-exchange optical pumping system this represents a substantial improvement over the way existing technologies utilize laser resources.

It is apparent that this invention significantly improves the effectiveness of existing laser systems used to polarize noble gases, and also enables the artisan to use smaller and cheaper lasers that are currently insufficiently powerful to accomplish the desired result by other means.

Thus, while there have been described what are presently believed to be the preferred embodiments of the present invention, those skilled in the art will realize that other and further embodiments can be made without departing from the spirit of the invention, and it is intended to include all such further modifications and changes as come within the true scope of the claims set forth herein.

BIBLIOGRAPHY

The following publications, mentioned in the foregoing specification, are incorporated herein by reference for all that they disclose:

Albert M S, Cates G D, Driehuys B, Happer W, Saam B, Springer C S, and Wishnia A, "Biological magnetic resonance imaging using laser-polarized $^{129}$Xe," *Nature* 370:199–201 (1994).

Anthony P L et al., "Determination of the neutron spin structure function," *Phys Rev Lett* 71:959–962 (1993).

Bouchiat M A, Carver T R, and Varnum C M, "Nuclear polarization in He$^3$ gas induced by optical pumping and dipolar exchange," *Phys Rev Lett* 5:373–377 (1960).

Bhaskar N D, Happer W, and McClelland T, *Phys Rev Lett* 49:25 (1982).

Cates G D, Fitzgerald R J, Barton A S, Bogorad P, Gatzke M, Newbury N R, and Saam B, *Phys Rev A* 45:4631 (1992).

Chupp T E and Wagshul M, *Phys Rev A* 40:4447 (1989).

Chupp T E, Hoare R J, Walsworth R L, and Wu B, *Phys Rev Lett,* 72:2363 (1994).

Cummings W J, Häusser O, Lorenzon W, Swenson D R, and Larson B, "Optical pumping of Rb vapor using high power Ga$_{1-x}$Al$_x$As diode laser arrays," *Phys Rev A* 51(6): 4842–4851 (1995).

Driehuys B, Cates G D, Happer W, Mabuchi H, Saam B, Albert M S, and Wishnia A, *Phys Lett A* 184:88 (1993).

Gatzke M, Cates G D, Driehuys B, Fox D, Happer W, and Saam B, "Extraordinarily slow nuclear spin relaxation in frozen laser-polarized $^{129}$Xe," *Phys Rev Lett* 70:690–693 (1993).

Happer W, Miron E, Schaefer S, van Wijngaarden W A, and Zeng X, "Polarization of the nucelar spins of noble-gas atoms by spin exchange with optically pumped alkali-metal atoms," *Phys Rev A* 29:3092 (1984).

Laloë F, Nacher P J, Leduc M, Schearer L D, *AIP Conf Proc* #131 (Workshop on polarized $^3$He beams and targets) (184).

Long H W, Gaede H C, Shore J, Reven L, Bowers C R, Kritzenbereger J, Pietrass T, Pines A, Tang P, and Reimer J A, *J Am Chem Soc* 115:8491 (1993).

Middleton H, "The spin structure of the neutron determined using a polarized $^3$He target," Ph.D, Thesis, Princeton University (1994).

Middleton H, Black R D, Saam B, Cates G D, Cofer G P, Guenther R, Happer W, Hedlund L W, Johnson G A, Juvan K, and Swartz J, "MR Imaging with hyperpolarized $^3$He gas," *Magn Reson Med* 33:271–275 91995).

Newbury N R et al., "Laser polarized munonic helium," *Phys Rev Lett* 69:391 (1992).

Raftery D, Long H, Meersman T, Grandinetti P J, Reven L, and Pines A, *Phys Rev Lett* 66:584 (1991).

Schearer L D, Phys Rev 180:83 (1969).

Zeng X, Wu Z, Call T, Miron E, Schreiber D, and Happer W, *Phys Rev A* 31:260 (1985).

What is claimed is:

1. A method of hyperpolarizing a noble gas by spin-exchange optical pumping, comprising:
   providing a polarization cell continuing a noble gas, a primary alkali metal, and an auxiliary alkali metal; and
   illuminating the polarization cell with radiation having a wavelength which optically polarizes the primary alkali metal; thereby enhancing spin-exchange interaction among the primary alkali metal, the auxiliary alkali metal, and the noble gas, whereby spin transfer to the noble gas yields hyperpolarized noble gas.

2. A method according to claim 1, wherein the vapor phase ratio of the primary alkali metal to the auxiliary alkali metal is between about 1:100 to 10:1.

3. A method according to claim 2, wherein the vapor phase ration of the primary alkali metal to the auxiliary alkali is between about 1:30 to 1:1.

4. A method according to claim 1, wherein the primary alkali metal is rubidium, the auxiliary alkali metal is potassium.

5. A method according to claim 4, wherein the vapor phase ratio of the rubidium to the potassium is about 1:3.

6. A method according to claim 1, wherein the primary alkali metal is potassium, and the auxiliary alkali metal is sodium.

7. A method according to claim 1, wherein the primary alkali metal is sodium, and the auxiliary alkali metal is potassium.

8. A method according to claim 1, wherein the auxiliary alkali metal has greater efficiency than the primary alkali metal in polarizing the noble gas.

9. A method according to claim 1, wherein the noble gas is $^3$He.

10. A method according to claim 1, wherein the polarization cell further contains at least one of a buffer gas and a quenching gas.

11. A method of hyperpolarizing a noble gas, comprising:
   a) optically polarizing a primary alkali metal by illumination with radiation having wavelength that is resonant with an electronic transition in the primary alkali metal;

b) transferring polarization of the primary alkali metal to an auxiliary alkali metal; and c) delivering polarization of the auxiliary alkali metal to a noble gas, thereby providing a noble gas having increased polarization.

12. A method according to claim 11, wherein the primary alkali metal is rubidium, and the auxiliary alkali metal is potassium.

13. A method according to claim 11, wherein the primary alkali metal is potassium, and the auxiliary alkali metal is sodium.

14. An apparatus for hyperpolarizing a noble gas by spin-exchange optical pumping, comprising:

a polarization cell containing a noble gas and an alkali metal hybrid, wherein the alkali metal hybrid comprises a primary alkali metal and an auxiliary alkali metal; and an optical pumping source configured to optically polarize the primary alkali metal in the polarization cell; wherein, in operation, the apparatus promotes spin-exchange interaction among the primary alkali metal, the auxiliary alkali metal, and the noble gas, whereby spin transfer to the noble gas yields hyperpolarized noble gas.

15. An apparatus according to claim 14, wherein the optical pumping source is configured to circularly polarize the primary alkali metal at a wavelength of resonance of the primary alkali metal.

16. An apparatus according to claim 15, wherein the optical pumping source generates a light comprising a wavelength corresponding to the primary resonance (D1) of the primary alkali metal.

17. An apparatus according to claim 14, wherein the vapor phase ratio of the primary alkali metal to the auxiliary metal is between about 1:100 to 10:1.

18. An apparatus according to claim 17, wherein the vapor phase ration of the primary alkali metal to the auxiliary alkali is between about 1:30 to 1:1.

19. An apparatus according to claim 14, wherein the condensed phase ratio of the primary alkali metal to the auxiliary alkali metal is between about 1:100 to 100:1.

20. An apparatus according to claim 14, wherein the primary alkali metal is rubidium and the auxiliary alkali metal is potassium.

21. An apparatus according to claim 20, wherein the vapor phase ratio of the rubidium to the potassium is about 1:3.

22. An apparatus according to claim 14, wherein the primary alkali metal is potassium and the auxiliary alkali metal is sodium.

23. An apparatus according to claim 14, wherein the primary alkali metal is sodium and the auxiliary alkali metal is potassium.

24. An apparatus according to claim 14, wherein the auxiliary alkali metal has an increased efficiency over that of the primary alkali metal in polarizing the noble gas via spin-exchange.

25. An apparatus according to claim 14, wherein the noble gas is $^3$He.

26. An apparatus according to claim 14, wherein the polarization cell further comprises at least one of a buffer and quenching gas.

* * * * *

UNITED STATES PATENT AND TRADEMARK OFFICE
CERTIFICATE OF CORRECTION

PATENT NO. : 6,318,092 B1  Page 1 of 1
DATED : November 20, 2001
INVENTOR(S) : Happer et al.

It is certified that error appears in the above-identified patent and that said Letters Patent is hereby corrected as shown below:

<u>Column 12,</u>
Line 2, should read as follows:
-- phase ratio of the primary alkali metal to the auxiliary alkali metal --

Signed and Sealed this

Fourteenth Day of May, 2002

Attest:

Attesting Officer

JAMES E. ROGAN
*Director of the United States Patent and Trademark Office*